(12) United States Patent
Panther et al.

(10) Patent No.: US 6,233,431 B1
(45) Date of Patent: May 15, 2001

(54) RADIO PAGE RECEIVER WITH AUTOMATIC CYCLICAL TURN ON

(75) Inventors: Gyles Panther, Stittsville; J. Peter Williams, Munster, both of (CA)

(73) Assignee: Silcom Research Limited, Kanata (CA)

( * ) Notice: Subject to any disclaimer, the term of this patent is extended or adjusted under 35 U.S.C. 154(b) by 0 days.

(21) Appl. No.: 08/108,510

(22) Filed: Aug. 18, 1993

Related U.S. Application Data

(62) Division of application No. 07/676,385, filed on Mar. 28, 1991, now Pat. No. 5,263,195.

(30) Foreign Application Priority Data

Mar. 28, 1990 (GB) .................................... 9006919
Mar. 28, 1991 (GB) .................................... 9106719

(51) Int. Cl.[7] .................................................. H04B 7/00
(52) U.S. Cl. ...................... 455/38.2; 455/343; 455/38.3
(58) Field of Search ............................... 455/38.2, 38.3, 455/343; 340/825.44

(56) References Cited

U.S. PATENT DOCUMENTS 5,274,483 * 12/1993 Murai et al. ..................... 455/38.3

FOREIGN PATENT DOCUMENTS

0024825 * 2/1991 (JP) ..................................... 455/38.3

* cited by examiner

Primary Examiner—Marsha Banks-Harold
(74) Attorney, Agent, or Firm—Pascal & Associates

(57) ABSTRACT

The present invention relates to a radio receiver for receiving a radio signal, a first circuit for beating the signal to zero intermediate frequency in phase and quadrature shifted signals, a circuit for amplifying the in phase and quadrature shifted zero intermediate frequency signals, a second circuit for beating the amplified intermediate frequency signals to predetermined non-zero intermediate frequency in phase and quadrature shifted signals, a summer for summing the non-zero signals, and a circuit for applying the summed signals to a discriminator to obtain an output signal. Other embodiments are extended POCSAG for enhanced battery saving, paging sequence numbers for reception integrity control, digital AFC, script control of the pager for organizer/schedule applications, a vibrator holster for improved pager format and saving of battery power, intelligent low battery detection, and features arising from electronic on/off function.

2 Claims, 4 Drawing Sheets

Figure 1:
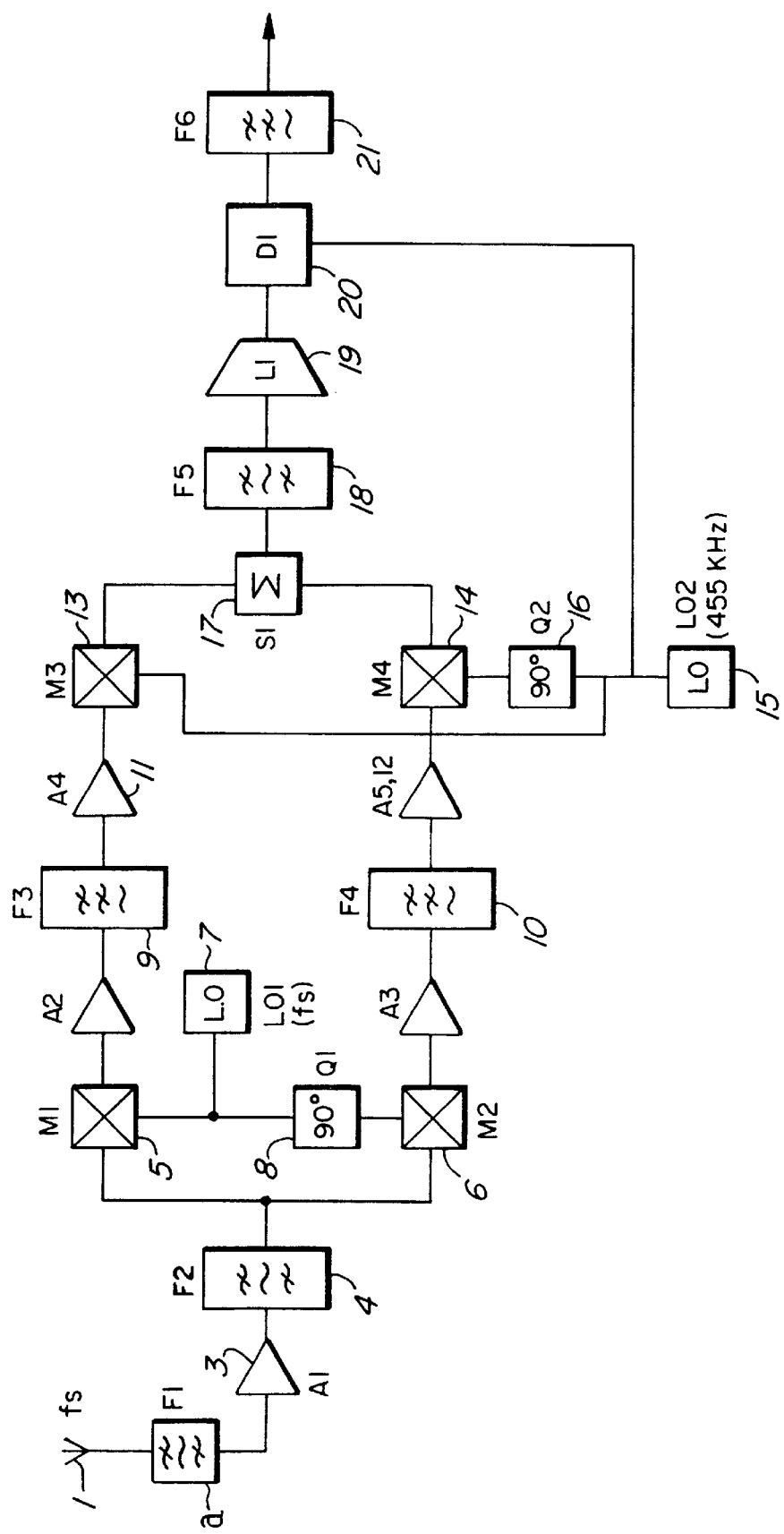

| BATCH | PREAMBLE | S C W | C W O 0 | C W I | C W O | C W I | C W O | C W I | C W O | C W I | C W O | C W I | C W O | C W I | C W O | C W I | C W O | C W I |
|---|---|---|---|---|---|---|---|---|---|---|---|---|---|---|---|---|---|---|
| | | | F0 | | F1 | | F2 | | F3 | | F4 | | F5 | | F6 | | F7 | |
| BINARY LENGTH | 576 | 32 | 64 | | 64 | | 64 | | 64 | | 64 | | 64 | | 64 | | 64 | |

FIG. 3

| CODE WORD | MSG | ADDRESS/DATA 20 BITS | CHECKBITS 10 BITS | PAR |
|---|---|---|---|---|

FIG. 4

| ADDRESS CODEWORD | HEADER CODEWORD | INSTRUCTION CODEWORD | MESSAGE CODEWORD |
|---|---|---|---|

FIG. 5

RADIO PAGE RECEIVER WITH AUTOMATIC CYCLICAL TURN ON

This application is a Division of application Ser. No. 07/676,385, filed Mar. 28, 1991. U.S. Pat. No. 5,263,195.

FIELD OF THE INVENTION

This invention relates to radio receivers, and particularly to systems and circuits which can enhance the operation of paging receivers.

BACKGROUND TO THE INVENTION

A conventional superheterodyne receiver (superhet) is based upon the mixing of a received signal with a local oscillator ("L.O.") signal to yield a new (intermediate frequency or "I.F.") signal which is the difference or sum of the L.O. and off-air signal frequencies. Tuning of the receiver is effected by varying the local oscillator frequency, thereby changing the frequency of the off air signal which when mixed with the L.O. signal, will yield a signal at a fixed I.F.

A disadvantage of the superheterodyne receiver is that received signals having a frequency higher or lower than the L.O. frequency and differing from the L.O. frequency by the I.F. either positively or negatively will mix to yield signals at the I.F. This is known as the reception of the "image" and may be partially overcome by the use of a higher intermediate frequency. This is often followed by a second conversion to a lower frequency where adjacent channel filtering is performed. Double superheterodyne receivers commonly have the first I.F. at 10.7 MHz so that the image frequency is 21.4 MHz away from the desired signal.

In order to save battery power, pager receivers "hibernate" or "sleep" for certain periods of time, turning themselves on regularly at predetermined intervals in order to check for addressing from a transmitter. One such form of time division multiplexed addressing is that specified in CCITT 584-1 paging format, also known as POCSAG. A disadvantage of this form of time division addressing is that power consumption is constant regardless of channel traffic. Another disadvantage is that if the receiver is required to receive large amounts of data to be transmitted during off peak hours it is necessary in current state of the art pagers to continuously operate, according to the paging code format.

Current state of the art radio pagers generally have their features and functions defined by firmware designed into the product, and most have a level of programmability, using special attachments, to provide for selection of alternate response characteristics from a small range of options offered. A disadvantage of this is that all of the receiver response characteristics have to be defined at the time of design and the receiver cannot be modified to meet the requirements of a specific user or service provider.

Current state of the art radio pagers generally include vibrators within the body of the pager so that the user may be silently alerted to the receipt of a page. For maximum effectiveness, it is necessary for such device to be firmly coupled to the wearer, as is the case when worn on a belt. The disadvantage of this is that when the pager is not so carried, the vibrator has limited effectiveness and an alternative form of alert is desirable.

Radio paging receivers commonly use replaceable Alkaline batteries or rechargable batteries of the same form interchangeably. The detection of low battery reserve is generally determined by evaluation of the terminal battery voltage under load. A disadvantage of this is that disposable battery discharge characteristics differ from those of rechargeable batteries and accurate detection of low battery reserve for both types using a common detection method is generally only accurate for one type.

AFC (Automatic Frequency Control) is very desirable on UHF (Ultra High Frequency) receivers operating above 500 MHz. At these frequencies the frequency errors in the crystal oscillators used to generate the local oscillator signals in the receiver amount to a few parts per million, and are comparable with, and can exceed, the frequency tolerance of the receiver (for maximum sensitivity). These errors result from sensitivity to temperature and from long term frequency drift caused by aging of the crystal.

AFC is widely used on analog systems. For such receivers on channel center, the integral of the deviation over a period of a few hundred milliseconds or less is zero, and because transmission (and reception) is continuous, capacitors can be used to integrate and store the AFC feed back signal.

Simple analog systems cannot be used in receivers which are strobed (for channel sampling) or which are designed to be used with digital, time dependent addressing techniques (such as CCITT 584-1). There are three principal difficulties:

a) In digital systems, the FSK (Frequency Shift Keyed) modulated carrier may contain very low frequency components due to long streams of 1's or 0's.

b) The periods between samples can be as long as one second so that analog techniques to store feedback signals (such as sample and hold) are marginal and errorrprone.

c) To minimize power consumption, the receiver should be prealigned to minimize the period time required by the receiver to sample the channel.

SUMMARY OF THE PRESENT INVENTION

One embodiment of the present invention is a novel form of superheterodyne receiver which does not have an image frequency.

In this embodiment, near and adjacent signal rejection filtering is largely achieved and the requirements for filtering are much reduced over that of the prior art. Further, low cost highly miniaturize IF filter elements, widely used in conventional superheterodyne receivers, can be used.

This receiver, unlike conventional single stage zero I.F. receivers, will reproduce analog frequency modulated signals, essential requirements for voice or fast digital signals.

The receiver of the present invention can be used in a digital radio pager which can have the following important novel features, structures and methods of operation:

1. Operation according to CCITT-584-1 paging format but with fully compliant extensions whereby battery saving can be substantially improved, including a means for the receiver power up infrequently but at defined times to provide for reception of data even when switched off.

2. Automatic Frequency Control of the pager which is able to operate on FSK data without regard to the length of consecutive equal data states transmitted, and which can operate on a time division multiplex address scheme such as CCITT 584-1.

3. Operation according to CCITT 584-1 Paging format but with fully compliant extensions whereby unlimited instructions can be transmitted to one or more than one pager, so as to tailor its response or operating characteristics to suit those of individual users or service providers.

4. Meanings of buttons or keys which constitute the users means of operating the pager can have their function altered, and the new meaning illustrated or indicated by the use of images presented on a dot matrix or other form or programmable display, in close proximity to the control button.

5. A holster designed to carry the pager has an integral clip for attachment to the wearer's apparel, in which is installed a vibrator. A detection means is included so that the alerting means, being audible, optical or vibrational can be automatically changed according to the users programmed preference when in or out of the holster.

6. A means for detecting the rate of change of the battery terminal voltage or internal resistance to provide for accurate low battery detection can be provided for either alkaline or rechargeable batteries.

An "intelligent" automatic frequency control (AFC) system can be provided in which the discriminator output level is integrated for a specific period, starting a fixed period after a logical transition. If data remains good (i.e. the state is retained for a minimum data period) the integrated voltage is stored and compared with a similar sample taken for the other logical state. The AFC signal is generated, proportional to the difference between these two samples, and the correction signal applied to a varactor in the local oscillator circuit, to control the frequency.

A "Script" method for controlling the pager response, comprised of a special escape sequence (e.g. a non-printable character) followed by a short form "language" to determine pager actions, can be used.

Messages are sent via a computer to one or more pocket pager devices. The pager simply acquires the message without response and displays it on request.

Alternatively the unit can be used with or as a scheduler, which can be dynamically loaded with new information by a secretary or dispatcher. This information is conveyed building, nation or continent wide depending upon the extent of the paging system accessed by the secretary. Preferably the pager is in the form of a small billfold (e.g. is credit card sized), and is generally used to forward messages to the user, at the same level of urgency as for telephone answering slips. A user could permit a limited number of persons to know the sequence whereby the device could be made to beep.

In accordance with an embodiment of the invention a radio receiver is comprised of apparatus for receiving a radio signal first apparatus for beating the signal to zero intermediate frequency in phase and quadrature shifted signals, apparatus for amplifying the in phase and quadrature shifted zero intermediate frequency signals, second apparatus for beating the amplified intermediate frequency signals to predetermined non-zero intermediate frequency in phase and quadrature shifted signals, apparatus for summing said non-zero signals, and apparatus for applying the summed signal to a discriminator to obtain an output signal.

In accordance with another embodiment of the invention, a radio receiver is comprised of apparatus for receiving and bandpass filtering a radio signal of predetermined frequency, a first local oscillator for generating a local oscillator signal having a frequency which is the same as the radio signal, apparatus for phase shifting the local oscillator signal by 90°, a first mixer for receiving the radio signal and the local oscillator signal and for providing a first in phase zero intermediate frequency signal, a second mixer for receiving the radio signal and the phase shifted local oscillator signal and for providing a second quadrature shifted zero intermediate frequency signal, low pass filter apparatus for filtering the intermediate frequency signals, a second local oscillator for generating a predetermined frequency local oscillator signal, apparatus for phase shifting the predetermined frequency local oscillator signal by 90° to provide a non-zero phase shifted local oscillator signal, a third mixer for receiving the in phase zero intermediate frequency signal and the predetermined frequency local oscillator signal and for generating a non-zero intermediate frequency signal, a fourth mixer for receiving the quadrature shifted zero intermediate frequency signal and the non-zero phase shifted local oscillator signal and for generating a non-zero quadrature shifted intermediate frequency signal, apparatus for summing the non-zero intermediate frequency signal and the non-zero quadrature shifted intermediate frequency signal, to form a summed non-zero intermediate frequency signal, and apparatus for discriminating the summed signal to provide an output signal.

In accordance with another embodiment of the invention, a superheterodyne F.M. radio receiver is comprised of a first local oscillator which includes a varactor for adjusting its frequency, a discriminator, and an automatic frequency control (AFC) circuit for generating an AFC signal, the AFC circuit comprising a first counter/register for storing the AFC signal as a digital signal, a digital to analog converter (DAC) for receiving an output of said counter/register, and apparatus for applying the output signal of the DAC to the varactor, whereby the AFC signal stored in the counter/register controls frequency adjustment of the first local oscillator.

In accordance with another embodiment of the invention, a radio page signal receiver is in combination with a belt clip with a vibrator alert apparatus fixed to the belt clip for applying vibration against the body of a wearer upon receipt of an alerting signal, and optionally a battery for powering the vibrator alert apparatus retained by the belt clip, apparatus in the belt clip for removably S retaining the removable radio receiver, and apparatus for coupling a vibrator alert enable signal from the receiver to the vibrator alert apparatus upon the receiver being retained in said belt clip.

In accordance with another embodiment of the invention, a page signal receiver is comprised of a battery, low and high load peripherals connected to the receiver, apparatus for operating a high load peripheral, a low battery reserve detector, and apparatus for substituting a low load peripheral for a high load peripheral upon detection of low battery reserve.

In accordance with another embodiment of the invention, a radio page receiver is comprised of apparatus for receiving high and low priority messages from a transmitter, apparatus for alerting and displaying the high priority messages, and apparatus for storing the low priority messages and for being enabled to display the low priority messages on demand by a user.

In accordance with another embodiment of the invention, a low battery detection circuit for electronic apparatus is comprised of a voltage comparator for sampling battery terminal voltage respectively under light and heavy loading, and for indicating a low battery condition when the rate of change of the sampled voltage or internal resistance is greater than a predetermined limit.

In accordance with another embodiment of the invention, a radio pager is comprised of apparatus for receiving a transmitted signal from a transmitter, apparatus for extracting a command signal and a message signal from the transmitted signal, and apparatus for operating the receiver in response to the command to control how the message signal is handled.

In accordance with another embodiment of the invention, a paging receiver includes apparatus for recognizing time slot bits in each of a plurality of time frames, and powering on in one of the time slots upon the detection of one of said time slot bits.

BRIEF INTRODUCTION TO THE DRAWINGS

Figure 2:
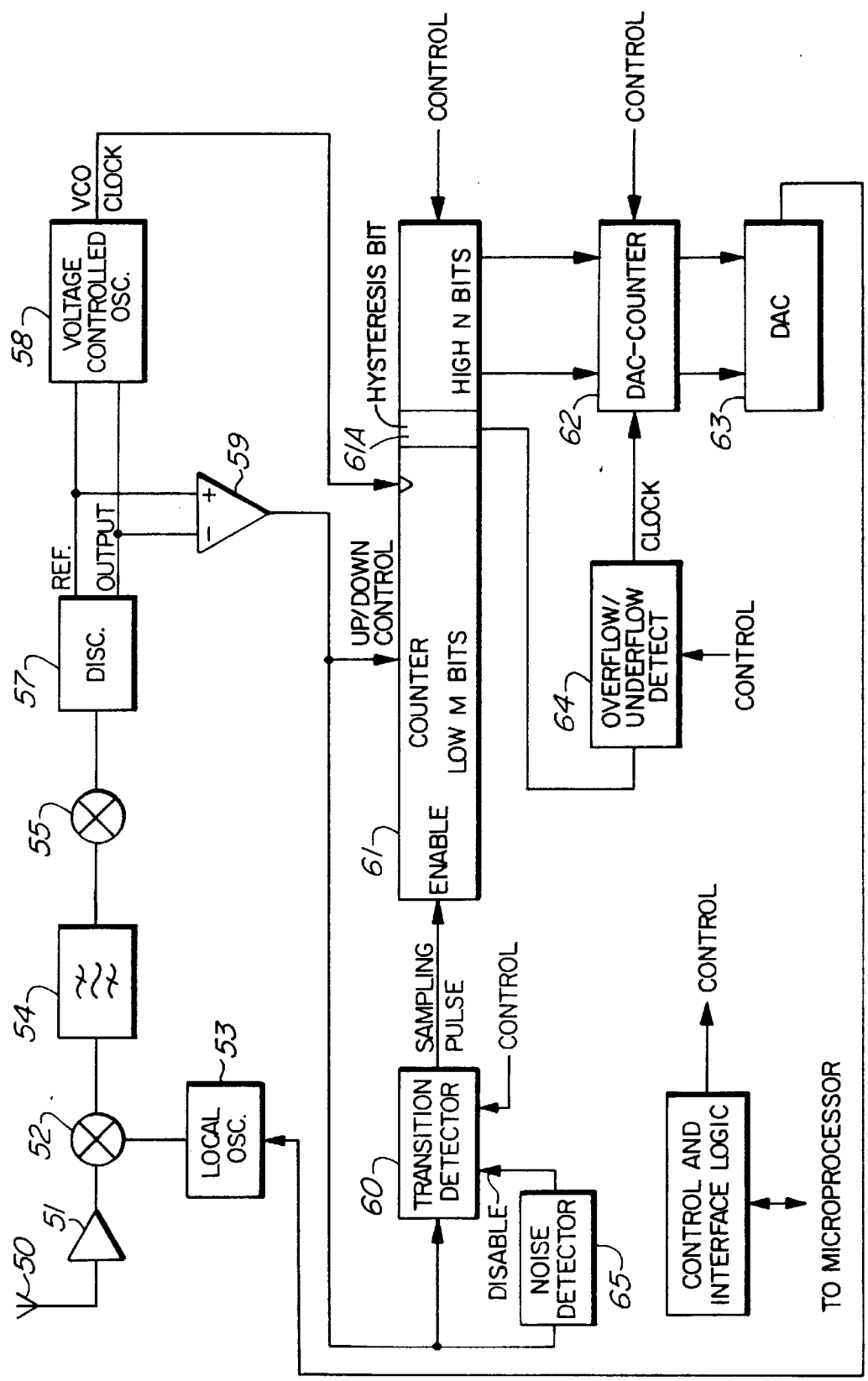
Figure 6:
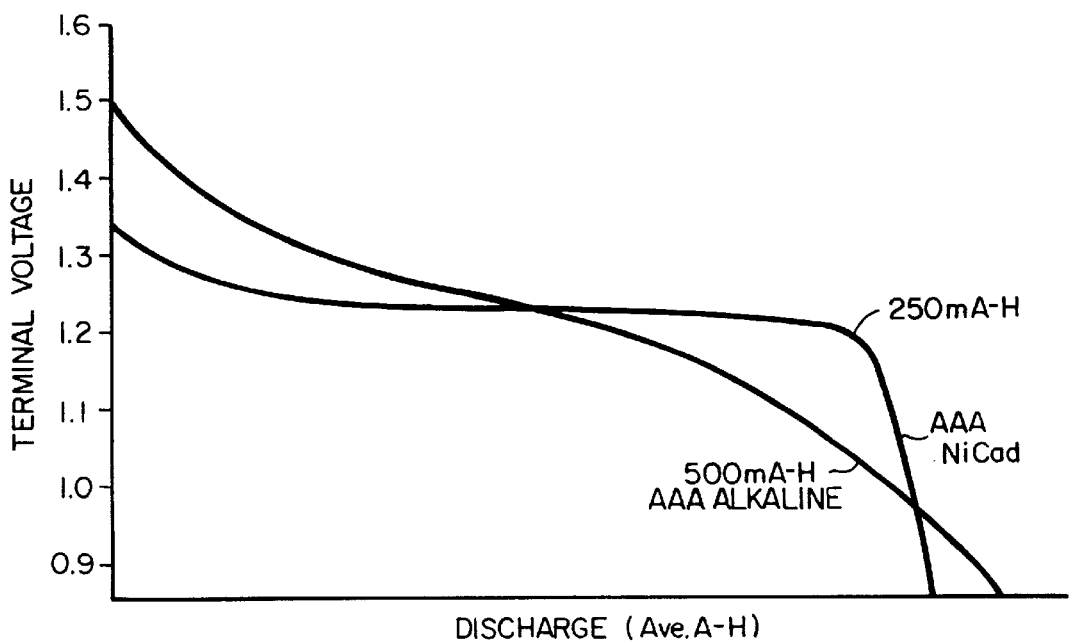
Figure 7:
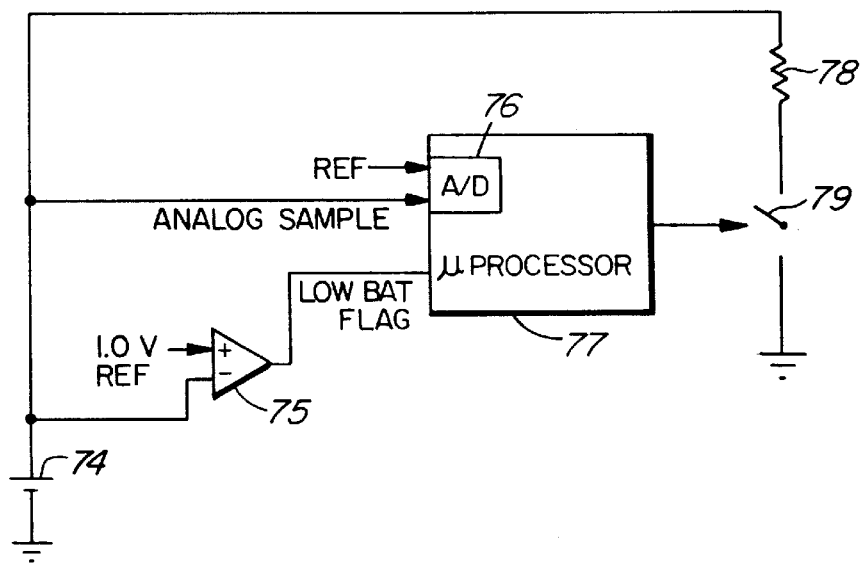

A better understanding of the invention will be obtained by reference to the detailed description below, in conjunction with the following drawings, in which:

FIG. 1 is a block schematic of a the intermediate frequency stages of a radio receiver according to an embodiment of the invention, FIG. 2 is a block schematic of a radio receiver particularly of the AFC loop, FIGS. 3, 4 and 5 are diagrams illustrating the structure of signals used in embodiments of the invention, FIG. 6 is a graph illustrating lifetime characteristics of alkaline and NiCd batteries, and FIG. 7 is a block diagram of a low battery detection system.

DESCRIPTION OF THE PREFERRED EMBODIMENTS

The new receiver, shown in FIG. 1, is a double superheterodyne. A received off-air signal from antenna 1 passes through a first bandpass filter 2, an amplifier 3 and a second bandpass filter 4, as in the prior art. The signal is then applied to two mixers 5 and 6. A local oscillator 7 is tuned exactly to the desired signal frequency, the output signal of which is mixed in mixer 5 with the off-air signal. The local oscillator output signal is also mixed with the off-air signal in mixer 2 after being phase shifted by 90° in phase shifter 8. The result at the output of mixer 5 is one of the resultant signals, which is the desired signal mixed down to a base band signal centered at 0 Hz. The negative frequency components are preserved in the quadrature channel, at the output of mixer 6.

The output signals of mixers 5 and 6 are filtered with simple R-C gyrator or active filter elements 9 and 10, which pass the low frequency desired signal. After being amplified in amplifiers 11 and 12, the signals in the two channels are applied respectively to mixers 13 and 14. A local oscillator 15 of preferably 455 kHz has its signal applied to mixer 13 and its signal applied to mixer 14 through 90° phase shifter 16. This up converts the signals in the two channels from zero intermediate frequency to 455 kHz. The output signals from the mixers 13 and 14 in the two channels are summed in adder 17, then pass band filtered in filter 18 using conventional components such as ceramic or L-C filters. The output of filter 18 is a frequency modulated signal containing the same information as the received signal but with a carrier frequency equal to the second local oscillator frequency, 455 kKz.

The up-converted signal at the output of filter 18 is amplified to a square wave in a limiting amplifier 19, and the square wave signal is then applied to a frequency discriminator 20. The modulating signal is extracted from the modulated carrier by continuous comparison of the frequencies of the local oscillator (455 kHz) and the modulated signal in the frequency discriminator.

The resulting output signal is passed through filter 21 for application to circuits which use the modulating signal.

The function of the receiver is described mathematically below.

Let the received signal $x_c(t)$ be represented by $$x_c(t)=A_c \text{Cos}(W_{ct}+\phi(t))$$

where
- $A_c$ is the carrier amplitude
- $W_c$ is the carrier radian frequency
- $\phi(t)$ is the time varying phase containing the modulating signal.

Let the 1st locaal oscillator signal $A_{oi}(t)$ be:

$$A_{oi}(t)=A_o \text{Cos}(W_o t)$$

Let the quadrature LO signal $A_{oq}(t)$ be:

$$A_{oq}(t)=A_o \text{Sin}(W_o t)$$

At the output of mixer M1 the signal is:

$$A_c \text{Cos}(W_c+\phi(t)), A_{oi} \text{Cos}(Wot)$$

After filtering this becomes $$\frac{A_{oi}A_c}{2}\cos((W_c - W_o)t + \phi(t))$$

Similarly, output signal from mixer M2, after filtering is $$\frac{A_{oi}A_c}{2}\sin((W_c - W_o)t + \phi(t))$$

Let the 2nd LO signal $x_{ki(t)}$ be $$A_{ki}(t)=A_k \text{Cos}(W_{kt})$$

and its quadrature signal be $$A_{kq}(t)=A_k \text{Sin}(W_k t)$$

At the mixer M3 output the signal is $$\frac{AoAc}{2}\cos((W_c - W_o)t + \phi(t)) \cdot AkCes(W_k t) =$$

$$\frac{A_o A_c A_c}{2}\left(\frac{1}{2}\text{Cos}((W_c - W_o - W_k)t + \phi(t)) + \frac{1}{2}\text{Cos}(W_c - W_o - W_k)t + \phi(t)\right)$$

Similarly, the output signal at mixer M4 O/P is given by:

$$\frac{A_o A_c A_k}{2}\left(\frac{1}{2}\text{Cos}((W_c - W_o - W_k)t + \phi(t)) - \frac{1}{2}\text{Cos}(W_c - W_o - W_k)t + \phi(t)\right)$$

By differencing the output of mixers M3, M4

$$v_o = \frac{A_o A_c A_k}{2}\text{Cos}((W_c - W_o - W_k)t + \phi(t))$$

This signal is the same as the input signal but with the carrier frequency shifted by the amount $-W_o+W_c$.

If $W_o=W_c$ then the output is exactly centered at $W_k$.

In the above analysis phases of signals have been taken as arbitrary and therefore ignored.

Advantages of the receiver are as follows:

1. Because the first IF is zero the receiver does not have an image frequency.

2. Near and adjacent channel signal rejection filtering is largely achieved in the 455 KHz section filter and the requirements for filtering in the zero I.F. section are much reduced over those required in a single stage zero I.F. receiver. Further, low cost, highly miniature 455 KHz filter elements, widely used in conventional superheterodyne receivers, can be used.

3. This receiver, unlike conventional single stage zero I.F. receivers will reproduce analog frequency modulated signals, an essential requirement for voice or fast digital signals.

4. The frequency errors introduced by the second I.F. conversion are eliminated because discrimination is achieved by frequency comparison of the received FM signal with the second local oscillator signal.

This makes the architecture inherently better suited for use in a synthesized first local oscillator receiver since, unlike conventional superheterodyne receivers, there is no frequency error contribution from the second I.F. stage.

A novel type of automatic frequency control (AFC) has been designed which solves the problems referred to earlier in this specification. It should be noted that the AFC embodiment described below can be used with the zero I.F. superheterodyne embodiment described above, or with a conventional superheterodyne circuit.

With reference to FIG. 2, certain elements of a conventional radio are an antenna 50 which feeds off air input signal to an RF amplifier 51, the output of which is applied to a mixer 52. A varactor controlled crystal oscillator 53 provides a local oscillator signal to mixer 52. The output signal at an intermediate frequency passes through an IF band pass filter 54, the output of which is applied to the input of a second mixer 55. A second crystal controlled oscillator 56 provides a local oscillator signal to mixer 55. The output signal of mixer 55 at a second IF frequency is applied to discriminator 57.

An analog voltage output of discriminator 57 is applied with a discriminator reference signal to the input of a voltage controlled oscillator 58. The analog voltage derived from the discriminator circuit indicates the instantaneous RF input deviation by the voltage differential between the analog discriminator output voltage and the reference voltage.

The output signal of the voltage controlled oscillator provides an output clock signal, the frequency of which is proportional to the absolute differential voltage at its input. Thus the voltage controlled oscillator 58 provides a rectifying action.

The discriminator output signal and the reference are also applied to the input of a comparator circuit 59, the output of which indicates the polarity of the deviation of the RF input relative to the locally defined channel center.

The resulting polarity signal output from comparator 59 is applied to a transition detection circuit 60, which generates an output pulse at each transition of the polarity signal, the period of which is less than a bit. The output pulse is a sampling signal and, because it is generated by transitions, an exactly equal number of 1's and 0's in the RF input are sampled.

Transition detection logic circuit 60 also stores the direction of the last transition in a latch, the state of which is maintained during receiver power down periods. Thus the alternating sampling continues uninterrupted by power down periods.

After a short delay to accommodate the RF data transition, the sampling pulse enables an up/down counter 61, the direction of the count being controlled by the polarity signal.

In each sample period, the counter 61 accumulates a number of counts proportional to the frequency differential as determined by the discriminator since the input of the counter is connected to the output of the voltage controlled oscillator 58. If the 0's and 1's are balanced (i.e. the radio is centered on a channel), the counter contents will oscillate about the initial value. However if the radio is unbalanced, the counter will accumulate a larger count for one state and the counter will overflow or underflow at a rate determined by the imbalance and the size of the counter.

The high N bits of the counter 61 are continuously loaded into a DAC counter/register 62. The output of the DAC counter is input to a digital to analog inverter 63. The output of DAC 63 is an analog signal which is applied to the varactor of the first local oscillator 53.

Thus a quantized feedback loop is created. Provided the polarity of the loop is negative, and provided other well known loop stability criteria are satisfied, a feedback loop is created which can store the feedback signal indefinitely, and which can operate uninterrupted over many strobed periods.

The feedback loop is digital and stores the values corresponding to the AFC feedback signal as a binary value in the counter/register 62. The output of the DAC, applied to the varactor in the first local oscillator circuit, provides means for frequency adjustment of the first local oscillator by the binary value stored in the register. Provided power is maintained to the register, the feedback signal can be preserved indefinitely and without degradation. In a preferred embodiment, the register is formed of CMOS transistors with negligible standby power consumption and the DAC is powered up and down at the same time as the radio.

A second mode of operation can be as follows. The high order N bits of the accumulator are not imposed on the N bits of the DAC counter. Instead, the existence of an underflow or an overflow of the accumulator is stored in an overflow/underflow detect circuit 64. At the end of the radio enable time, the DAC counter is "nudged" to count one bit in the direction of the overflow/underflow or is left unchanged. The benefit of this is that no AFC adjustment is made while the radio is operational.

To prevent "dickering" of the contents of the bits applied to the DAC, hysteresis is built into the counter at a bit position 61A defined by the desired loop characteristics. The nature of the hysteresis is such that, after a transition at the defined counter bit (in the counter chain), two count inputs to that bit in the opposite direction are necessary to cause a reversal. For example, if the bit counted up to a "1", then two down count pulses are necessary to cause the bit to downcount to "o". The effect of this is to provide hysteresis, the magnitude of which is equal to the modulus to the section of the counter below the defined hysteresis bit position.

A noise detector 65 is also preferred to be used to monitor the data signal from the radio discriminator and, in the event that noise is detected, indicating that the AFC is unreliable, the AFC circuit disabled.

The AFC control system described above may also be used to provide an offset to adjust either for manufacturing tolerances or, if a means of temperature sensing is available to the control processor, for approximate temperature compensation for the combined crystal and crystal oscillator temperature coefficients.

The following describes an Embodied Command Language that can be used to provide digital radio paging systems and receivers with enhanced control of the decoding and interpretation of message information sent to a receiving device.

The embedded command language instructions are encoded into the message being sent to the receiving device. The structure of the embodied command language will not interfere with the normal operation of a radio paging system and does not require any change to the structure of the radio paging system control equipment or data input devices.

The described embedded command language features are based on the use of the POCSAG digital paging protocol as defined in the CCIR Recommendation 584-1 (or Radio Paging Code No. 1 "RPC1").

Standard radio paging systems provide for the delivery of messages to remote receivers. these messages are initiated by suitable input devices:

(a) Touch Tone telephones can generate numeric information such as telephone numbers or coded messages using digits only.

(b) Computerized devices (Page Entry Terminals "PET" or terminal devices connected directly to the paging terminal) can generate complete alphanumeric messages.

A major factor in the economic benefits from operating a paging/messaging system is being able to provide a wide range of information with the smallest amount of data sent over the system/network. The use of embedded command language instructions enable the use of standard message formats contained within the receiving device which can be completed with message information sent to the receiving device.

FIG. 3 shows the structure of the POCSAG transmission protocol, in which:

| | |
|---|---|
| Batch | represents one complete POCSAG protocol cycle; |
| Preamble | is a synchronizing sequence of data reversals; |
| SCW | is a unique 32 bit data sequence after which follows eight individual data frames F0 through F7; |
| CW0–CW1 | each frame F0–F7 consists of two code words (shown in Figure 4); |
| MSG | represents a single information bit that defines how the following 20 bits of information are to be used, either as address or data information; |
| Access/Data | This 20 field represents either 20 bits of 18 address bits and 2 function bits. The two function bits FNI FN2 identify four possible types of paging service (see Table 1) |

TABLE 1

Function Bit Assignments

| FN1 | FN2 | Service Function |
|---|---|---|
| 0 | 0 | Numeric messages |
| 0 | 1 | No messages (tone) |
| 1 | 0 | No messages (tone) |
| 1 | 1 | Alphanumeric messages |

If this code word represents a message code word the 20 bits of data can be formatted in two ways.

(a) As numeric information only and coded as shown in Table 2 which is based on Binary Coded Decimal (BCD).

TABLE 2

Numeric only character set

| 4-bit Combination Bit No. 4 3 2 1 | Displayed Character |
|---|---|
| 0 0 0 0 | 0 |
| 0 0 0 1 | 1 |
| 0 0 1 0 | 2 |
| 0 0 1 1 | 3 |
| 0 1 0 0 | 4 |
| 0 1 0 1 | 5 |
| 0 1 1 0 | 6 |
| 0 1 1 1 | 7 |
| 1 0 0 0 | 8 |
| 1 0 0 1 | 9 |
| 1 0 1 0 | Spare |
| 1 0 1 1 | U |
| 1 1 0 0 | Space |
| 1 1 0 1 | Hyphen |
| 1 1 1 0 | ] close bracket |
| 1 1 1 1 | [ open bracket |

(b) As alphanumeric information coded in seven bit code based on the CCITT Alphabet No.5 (ASC11) based on coding formats shown in (a) and (b) above the system can send up to 5 numeric characters or 2-6/7 alphanumeric characters in each data code word.

checkbits This 10 bit data field is used in the error detection and correction process of the POCSAG protocol.

PAR represents a single parity bit used in the error detection process.

The embodied command language (ECL) provides a means to transmit, to a receiving device, messages containing encoded instructions within the normal protocol of the messages. When decoded, these instructions specify the way in which the information, contained in the message, is handled by the receiving device. These instructions are in a format that will allow future, virtually unlimited extensions of the embodied command language, and yet remain fully compliant with current protocols for messaging. The format conforms with the POCSAG code word structure shown in FIG. 4.

Receiving devices with this capability may be programmed to respond to address and messages (normal operation), and by virtue of the ECL, address specific commands, and system wide or group specific commands. Multi-recipient codes (addresses) are referred to as broadcast address codes (BAC's). the paging network will reserve at least 8 unique BAC's, one corresponding to each of the POCSAG time slots (F0–F7 shown in FIG. 3).

FIG. 5 shows an embedded command language instruction contained within a typical POCSAG message, in which:

ADDRESS CODE WORD: is the standard POCSAG code word representing the receiving device address.

HEADER CODE WORD: is a special code word structured to alert the receiving device that this code word may contain embodied command language instructions.

INSTRUCTION CODE WORD: additional (unlimited) operational message code words which provide 20 binary bits that may be used for further instructions or data or gating keys.

MESSAGE CODE WORDS: message code words which may be standard numeric or alphanumeric or which may be interpreted by the receiving device in the manner defined by the embedded commands received in the previous message code words.

The ECL is coded by the sending device (e.g. PET) in binary and structured to conform with the POCSAG data code word format. By this method and ECL instruction/s can be sent by the paging network to either numeric or alphanumeric receiving devices.

With reference to FIG. 3, 20 bits of data contained in the first data code word (CW0 or CW1) following the address code word of the receiving device, is called the ECL header code word. the header code word contains the following elements;

(i) Embodied Command Language Key
(ii) Embodied Command Language Instructions

These elements of the ECL header code word are extracted from the header code word as follows:

Each receiving device contains a command key mask (CKM) which is logically ANDed with the header code word in each correctly addressed message. The resultant 20 bit binary value (MRES) is compared with the command key code word (CKCW). If the comparison is true, the CKM is complimented and then ANDed with the header code word. The resulting digital word embodied command language instruction (ECL1), the length of which is determined by the command key format, is used to provide instructions and or parameters, as may be defined by the network operator. It is allowable for the receiver to have more than one CKM and/or CKCW. (see Table 3 for one example).

TABLE 3

| | |
|---|---|
| Header Code word | 1 1 0 1 0 1 0 0 1 1 0 0 0 1 1 1 0 1 1 0 |
| Mask (CKM) | 0 0 0 0 1 1 1 1 1 0 0 0 1 1 1 0 0 0 0 0 |
| Result (MRES) | 0 0 0 0 0 1 0 0 1 0 0 0 0 1 1 0 0 0 0 0 |
| Compliment CKM | 1 1 1 1 0 0 0 0 0 1 1 1 0 0 0 1 1 1 1 1 |
| Instruction (ECL) | 1 1 0 1 0 0 0 0 0 1 0 0 0 0 0 1 0 1 1 0 |

The format and function of the MRES word may be system operator defined. It could, for example, be used to provide immediate instruction or alternatively could be logically operated upon using a code private to the receiver (such as the serial number) to provide more secure access to some or all of the features.

The MRES word is assembled from the command language header by setting command language key bits to a known state so that the variable bits are those in the balance of the header. Note that if the service provider chooses to use the entire 20 bit code space of the command language header of the command language key, there will be no command message word, since all bits are defined.

Interpretation of the command message word is not defined but it is envisaged that control of the receiver by off air commands will fall into three categories;

1. Class 1 Commands

Instructions within this category temporarily alter the behaviour of the receiver, most probably for the specific message attached. This could include beeper overrides, display timeouts, etc.

An important instruction could be to add another address to the receiver's current addresses to allow multiple receivers to be updated with specific information, after which the new address would be discarded.

Another important instruction could be to s use the combination of a subsequent message code word combined with a receiver private code word (such as the serial number) to decode a message which is encrypted.

Another important instruction could be to store the subsequent message data in specific areas of memory to provide for updating of one data base in a receiver containing several data bases.

Another instruction could be to combine the subsequent message data with one of a number of is "forms" stored within the receiver.

Another important instruction could be to substitute data stored within the receiver in place of the transmitted command(s) and data contained with the embodied command language instruction, for the purpose of data compression.

2. Class 2 Commands

This instruction group commands the receiving device to modify its internal parameters and preferably requires confirmation from the user. These commands include changing the default operational settings of the receiving device as well as providing updates to certain information.

3. Class 3 Commands

Commands of this class are preferably limited to those which radically change the behaviour of the receiving device such as baud rate or permanent addresses, and require the user to confirm the integrity of the received message using encoded character sequences sent to the receiving device, which can be used by the service provider to confirm receipt of the command. The service provider can then send a further command to the receiving device which then verifies and enables the previous command.

Extended POCSAG for enhanced battery saving

As noted above, in order to provide a paging receiver with reasonable operating performance for extended periods from internal battery supplies, a power saving mechanism is used. The POCSAG protocol allows each receiver to remain in an idle (powered down) state with a 14/17 duty cycle. During each power-up period the receiver must search for a preamble or other recognizable POCSAG format. The basic POCSAG data format consists of eight groups of two code words. These groups correspond to individual time slots (Frames F0–F7). Once the receiving device has attained batch synchronization, by correctly detecting the unique sync code word (SCW FIG. 3) it now only needs to listen to data in the time slot (F0–F7) that may contain its own address.

Predictive Address Slot Wake-Up Inhibit

The pagers have a capability to "sleep" on command (i.e. go to low power mode) for a dynamically controlled period of time. The command takes the form of a special address that affects all pagers preprogrammed to so respond with a time slot address corresponding to the frame in which the command is transmitted. The sleep period should be integral numbers of batches (typically 4–32 seconds, approx.) as determined by the contents of a message word in the second code word of the time frame. In the absence of a sleep command, the pagers should operate in the standard POCSAG format.

By slightly increasing call latency, the paging terminal accumulates a "Que" of pending pages. Groups of batches are assembled and "packed" so as to both make optimum use of the air time and such that some of the time slot addresses may be deactivated because no pages are contained in the group for those pagers. Deactivation messages are preferably included with the batch.

In non-busy systems, pagers preferably should sleep for some arbitrarily high fraction of time (for a 16 second sleep time this should be 15/16). By re-allocation of addresses, pagers with a 24 hour pattern of use are preferably put on a frequently used time slot, and others put into a low duty cycle mode.

Non-compatible pagers should not respond to the special address and thus would not be affected. Similarly, compatible pagers missing the sleep command because of errors, or out-of-range conditions or a non-compatible system, default to the POCSAG standard sampling rate. This system may therefore be considered to be a transparent overlay to a standard POCSAG system.

Electronic On/Off

In the past, paging receivers had ON/OFF switches which entirely removed the battery power from the internal electronics within the pager. With the development of very low power logic, it has become possible to develop pagers in which the internal logic is switched to a very low current state. Thus, previously received messages can be retained in memory and real time clocks (used to time stamp incoming messages) can continue to operate in the OFF state. Some pagers also have the capability to automatically turn ON and OFF at preset times.

A separate issue is the growing requirement to send large amounts of data over paging systems. The loading of such systems is such that demand is high in peak business hours and light at other times. Radio common carriers have an obvious incentive to offer data services but generally do not have the system capacity to provide this at peak traffic periods. Depending on the urgency of the data, it would be desirable to transmit most of this data during off peak times (such as overnight). the electronic ON/OFF system of this invention has the above capabilities and also has the ability to resume normal operation at preset times to provide for data base transmissions.

Data Reception While OFF (a) In the OFF state, the paging receiver has an internal crystal controlled clock which continues to operate, and a memory which is maintained.

(b) In response to instructions received off-air from the paging system using the script command language described elsewhere herein, the pager can be instructed to "listen" to the channel at a specific time for a specific period, even if switched OFF by the user.

(c) Because of the high accuracy of the crystal clock and the fact that its accuracy is maintained by repeated broadcast updates from the paging system, the wake up while off periods can be short, and thus the additional power drain negligible.

(d) Data within a single data base might be separated into various priority classes. Non urgent (low priority) data is sent off peak (or opportunistically), while urgent updates are sent with normal message priority. This would apply to private (insurance tariffs or real estate listings) and public (news and stock quotes, etc.) data base services.

The "Vibra-clip"

An alerting vibrator is very useful in noisy environments or in situations when alerts must be silent, but the alert is only reliable when the pager is mechanically fixed against the body, such as on a belt.

We therefore take advantage of this situation by mounting the vibrator and its associated battery in a detachable belt clip into which the pager can be held. This has two principal advantages: first, the radio pager battery is removable from the belt clip and therefore separate from the vibrator battery so that the vibrator load does not cause premature battery failure, and second that the pager battery can be very much smaller (such as button cells), and battery lifetime extended. Operation of the vibrator is triggered by a signal within the pager and is coupled to the holster by either an optical signal or a metallic contact. The pager can be operated removed from the belt clip without operating the vibrator.

Intelligent Low Battery Detection

With battery operated equipment, is desirable to be able to detect and signal to the user when the battery is approaching the end of its useful life, or in the case of a rechargeable battery, that recharging is necessary. Ideally, this should be done at the point in the battery discharge when at least 1–2 days of operation remain, so as to give the user a reasonable chance to replace or recharge the battery.

The commonly used technique to detect low battery is comparison of the terminal voltage of the battery under a specific load to a reference, and if the terminal voltage is less, low battery is flagged. This technique works well for a specific battery type because the battery terminal voltage with discharge is highly predictable.

However, alkaline batteries are commonly used interchangeable with rechargeable NiCd batteries and these batteries have different discharge characteristics (see FIG. 6). A voltage threshold detection apparatus properly set up for an Alkaline battery would not detect low battery soon enough for NiCd batteries and vice versa.

In portable radio equipment particularly, a variety of loads are applied to the battery in normal use. The control logic and radio receiver are relatively light loads, while enunciation transducers (such as vibrator motors) are relatively heavy loads. A near-exhausted battery usually has sufficient capacity to continue to operate the receiver but application of a heavy load can reduce the terminal voltage to the point that a system reset is generated.

The low battery detection invention makes use of a microprocessor (or microcontroller) which has an analog to digital converter, optionally combined with a conventional low battery detection system.

With reference to FIG. 7, the reference voltage of comparator 75 is set to be equal to that appropriate for the lowest battery detection voltage for any battery 74 that might be used. Microprocessor 77 monitors the output from the voltage threshold comparator 75 and in addition, measures with A/D converter 76, the battery terminal voltage under a very light load 78 and under a defined, higher load 78. The sampling interval (e.g. represented by means for sampling switch 79) in the preferred embodiment is 1 mS.

(a) If the comparator is switched (i.e. low battery is detected) the equipment will signal low battery to the user, regardless of other considerations.

(b) The terminal voltage samples taken by the microprocessor are processed to calculate the internal battery resistance and its derivative (i.e. rate of change) over a period of hours. If either of the terminal resistance or its derivative exceed preprogrammed limits, low battery is signalled to the user.

(c) Terminal voltage and internal resistance for most battery types is a function of temperature. Allowance for temperature effects is included by virtue of the chosen limits.

(d) There is no attempt to introduce temperature compensation because batteries truly have limited lifetimes at temperature extremes, even if useful life would remain at a different temperature.

(e) As a battery becomes discharged it may not be capable of continued operation under the heaviest of loads. Thus if the voltage threshold comparator is tripped under heavy load (such as a vibrator), the load can be removed and a lower current form of enunciation used such as beeper. This would be a change of function from the user's viewpoint and would be accompanied by a message on the display indicating low battery.

(f) To eliminate confusing signalling due to recovery in the battery, the low current capability is latched and the latch reset by a system reset, or a measured terminal voltage greater than a preset threshold. This would allow the battery to recover from low temperature caused low battery condition.

(g) High load elimination may also be initiated if a measured light-load terminal voltage is less than a pre-determined threshold.

(h) All the above apply to newer types of battery likely to be introduced over the next 2–5 years, such as nickel hydride rechargeable batteries, etc.

The activation of the programmed auto ON/OFF function is in addition to the normal function of the ON/OFF control to disable the receiving device.

A person understanding this invention may now conceive of alternative structures and embodiments or variations of the above. All of these which fall within the scope of the claims appended hereto are considered to be part of the present invention.

We claim:

1. A radio pager receiver comprising means for manually shutting the receiver off, means for automatically turning on the manually shut off receiver for receipt and storage of cyclically transmitted wireless messages at predetermined times, and means for automatically shutting off the automatically turned on receiver after one of receipt of said wireless messages and determining that no such wireless messages exist.

2. A method of operating a radio paging receiver comprising manually shutting the receiver off, automatically turning on the manually shut off receiver at predetermined times for receipt and storage of cyclically transmitted wireless messages, and automatically shutting off the automatically turned on receiver after one of receipt of said wireless messages, and a determination that no such wireless messages exist.

* * * * *